United States Patent
Jin et al.

(10) Patent No.: US 10,304,974 B2
(45) Date of Patent: May 28, 2019

(54) SOLAR CELL

(75) Inventors: Yoonsil Jin, Seoul (KR); Goohwan Shim, Seoul (KR); Youngho Choe, Seoul (KR); Changseo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 94 days.

(21) Appl. No.: 13/301,947

(22) Filed: Nov. 22, 2011

(65) Prior Publication Data

US 2012/0060917 A1    Mar. 15, 2012

(30) Foreign Application Priority Data

Feb. 9, 2011    (KR) .......................... 10-2011-0011511

(51) Int. Cl.
*H01L 31/0224*    (2006.01)
(52) U.S. Cl.
CPC ...... *H01L 31/022433* (2013.01); *Y02E 10/50* (2013.01)
(58) Field of Classification Search
CPC .. H01L 31/022433; H01L 31/00; Y02E 10/50
See application file for complete search history.

(56) References Cited

U.S. PATENT DOCUMENTS

| | | | |
|---|---|---|---|
| 4,366,336 A * | 12/1982 | Donaghey ....... | H01L 31/022425 136/252 |
| 4,694,115 A * | 9/1987 | Lillington et al. ............ | 136/256 |
| 5,116,427 A | 5/1992 | Fan et al. | |
| 2004/0200522 A1 * | 10/2004 | Fukawa et al. ............... | 136/259 |
| 2007/0068570 A1 * | 3/2007 | Kim et al. ..................... | 136/256 |
| 2010/0065117 A1 | 3/2010 | Kim et al. | |
| 2010/0218818 A1 * | 9/2010 | Kang et al. ................... | 136/256 |
| 2010/0224228 A1 | 9/2010 | Kim et al. | |
| 2010/0258178 A1 * | 10/2010 | Jang et al. .................... | 136/256 |
| 2010/0275987 A1 * | 11/2010 | Sakamoto ......... | H01L 31/03529 136/256 |
| 2011/0126877 A1 * | 6/2011 | Kim et al. ..................... | 136/244 |

FOREIGN PATENT DOCUMENTS

| JP | 10-190033 A | 7/1998 |
|---|---|---|
| WO | WO 2006/029250 A2 | 3/2006 |

OTHER PUBLICATIONS

Gangopadhyay et al., Front Grid Design for Plated Contact Solar Cells, IEEE 2002, 399-402 (Year: 2002).*

* cited by examiner

*Primary Examiner* — Shannon M Gardner
(74) *Attorney, Agent, or Firm* — Dentons US LLP

(57) ABSTRACT

A solar cell is provided comprising a substrate, a first insulating layer on a first surface of the substrate, the first insulating layer having a plurality of first openings that expose portions of the substrate, and a plurality of first electrodes electrically connected to the substrate through the first openings, wherein one or more of the first electrodes are configured so that a width of an upper portion located on the first insulating layer is wider than a width of a lower portion located in a corresponding first opening.

32 Claims, 7 Drawing Sheets

SOLAR CELL

This application claims priority to and the benefit of Korean Patent Application No. 10-2011-0011511, filed in the Korean Intellectual Property Office on Feb. 9, 2011, the entire contents of which is incorporated herein by reference.

BACKGROUND

Field of the Disclosure

The embodiments of this document are directed to a solar cell.

Discussion of the Related Art

Solar cells convert solar light into electric power using the photovoltaic effect.

A solar cell includes a substrate and an emitter portion that form a PN junction. Light incident on a surface of the solar cell is converted into current. In general, light is received only through one surface, thus exhibits low photovoltaic efficiency.

There is a need for a bifacial solar cell that receives light through two opposite surfaces of the solar cell.

SUMMARY

According to an embodiment of this document, there is provided a solar cell comprising a substrate, a first insulating layer on a first surface of the substrate, the first insulating layer having a plurality of first openings that expose portions of the substrate, and a plurality of first electrodes electrically connected to the substrate through the first openings, wherein one or more of the first electrodes is configured so that a width of an upper portion located on the first insulating layer is wider than a width of a lower portion located in a corresponding first opening. According to an embodiment, one or more of the first electrodes include an electroplated layer.

The first openings are formed in a hole pattern or in a stripe pattern. According to an embodiment, a width of a first opening is less than a half a width of an upper portion of the first electrodes.

The number of the first openings is the same as the number of the first electrodes or the number of the first openings is more than two times the number of the first electrodes.

At least two first openings are located at one or more of the first electrodes, wherein the at least two first openings are spaced apart from each other in a longitudinal direction of the first electrodes.

The solar cell further comprises a plurality of first current collectors that cross the plurality of first electrodes and are connected to the plurality of first electrodes, and the first insulating layer further comprises a plurality of second openings that exposes portions of the surface According to an embodiment, one or more of the first current collectors include an electroplated layer.

A width of an upper portion of a first current collector is wider than a width of an upper portion of a first electrode, wherein the first current collectors are connected to the substrate through corresponding second openings.

The second openings are formed in a hole pattern or in a stripe pattern. According to an embodiment, a width of a second opening is less than a half a width of an upper portion of a first current collector.

A width of a second opening is more than a width of a first opening. A width of a second opening is equal to or less than a width of a first opening.

The number of the second openings is the same as the number of the first current collectors.

The number of the second openings is two times the number of the first current collectors.

At least two second openings are located at one or more of the first current collectors, wherein the at least two second openings are spaced apart from each other in a longitudinal direction of the first current collectors.

At least two second openings are located at one or more of the first current collectors, wherein the at least two second openings are spaced apart from each other in a width direction of the first current collectors. One or more of the first current collectors include at least two contact portions that contact the substrate in a width direction of the first current collectors.

According to an embodiment, the first and second openings are formed by dry etching using a laser.

For example, in the case that the first insulating layer includes a lower layer and an upper layer, the upper layer is first removed by dry etching using a laser, and the lower layer is then removed by wet etching using the upper layer as a mask, thus forming the first and second openings.

A contact portion of the first electrode which contacts the substrate has a width smaller than a width of an upper portion of the first electrode, and a contact portion of the first current collector which contacts the substrate has a width smaller than a width of an upper portion of the first current collector.

This reduces a recombination loss due to a metal constituting the first electrode and first current collector, thus increasing an open voltage.

Forming the first and second openings using both the dry etching and wet etching may prevent the substrate from being damaged and may eliminate the need for providing a separate wet process for getting rid of particles compared to forming the first and second openings using only dry etching.

Further, in comparison with the formation of contact lines using only wet etching, the embodiments of this document may effectively suppress increase in line resistance of the first electrode while forming the first electrode to have a thin width.

DETAILED DESCRIPTION OF THE EMBODIMENTS

Figure 1:
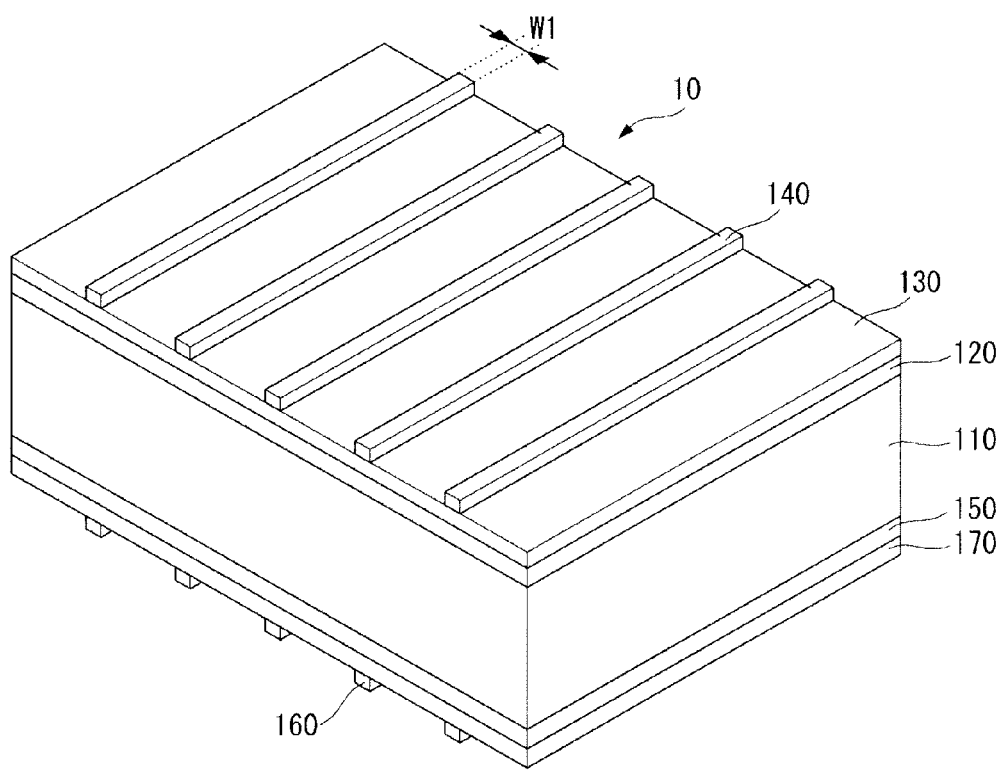
FIG. 1 is a perspective view illustrating a portion of a solar cell according to an embodiment of this document.

The embodiments of this document will be described in more detail with reference to the accompanying drawings, wherein like reference numerals may be used to designate like or similar elements throughout the specification and the drawings.

It will be understood that when an element such as a layer, film, region, or substrate is referred to as being "on" another element, it can be directly on the other element or intervening elements may also be present.

In contrast, when an element is referred to as being "directly on" another element, there are no intervening elements present.

Figure 2:
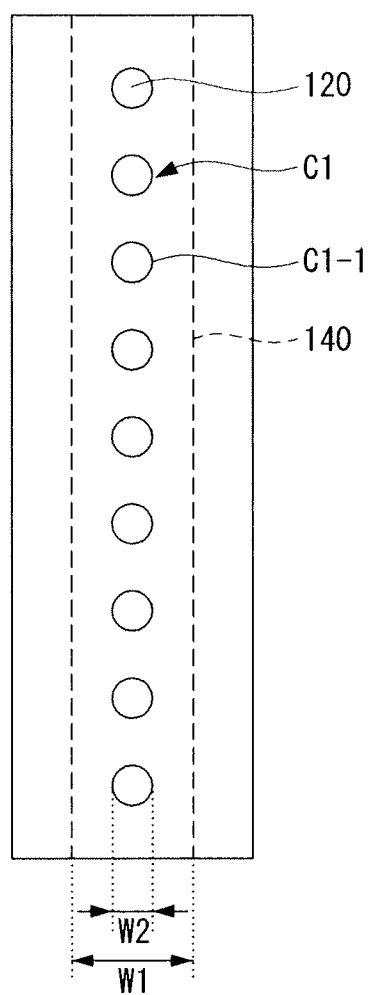
FIG. 2 is a plan view illustrating an embodiment of a first opening pattern.
Figure 3:
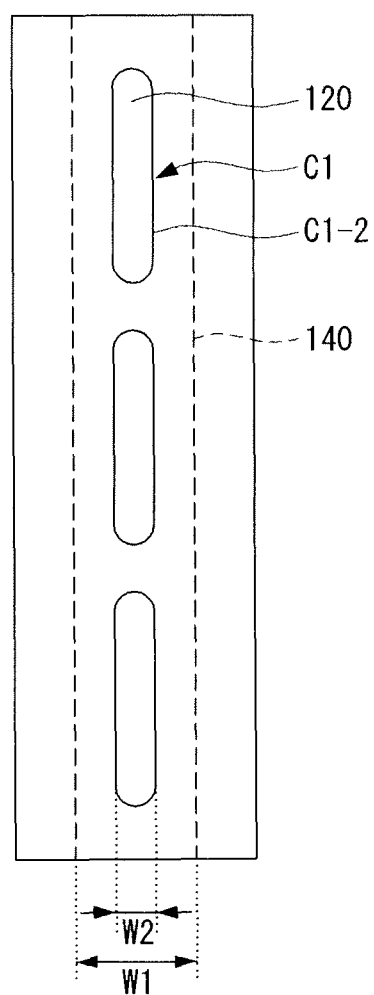
FIG. 3 is a plan view illustrating a variation to the first opening pattern shown in FIG. 2.
Figure 4:
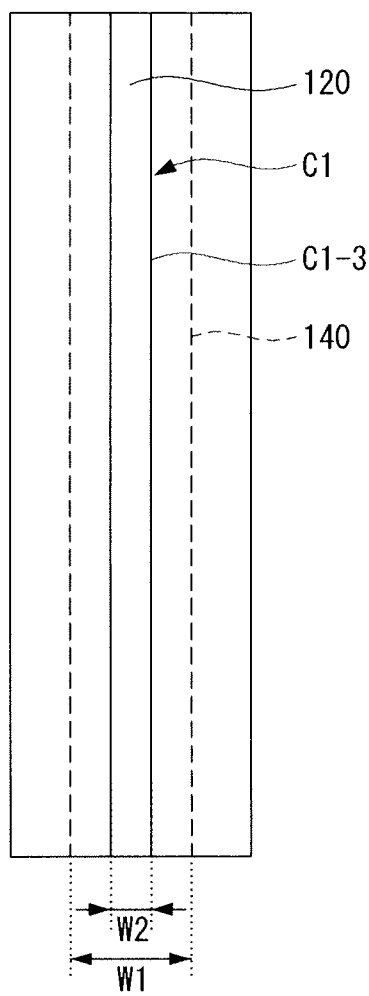
FIG. 4 is a plan view illustrating a variation to the first opening pattern shown in FIG. 2.
Figure 5:
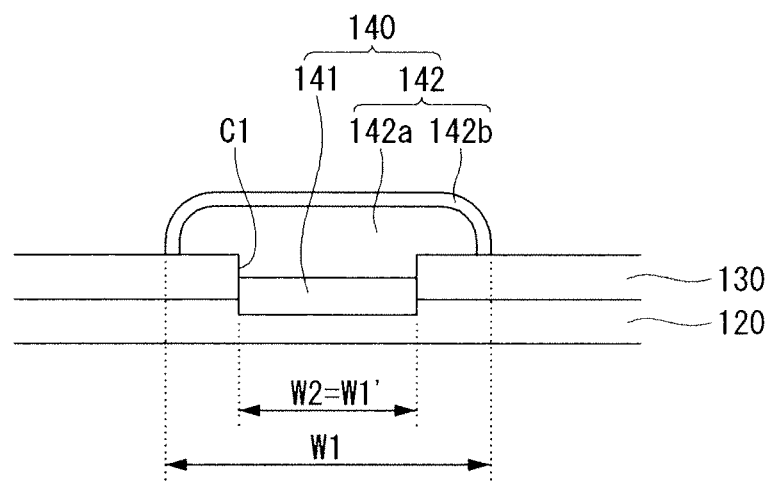
FIG. 5 is a cross sectional view illustrating a first electrode in a width direction.

FIG. 1 is a perspective view illustrating a portion of a solar cell according to an embodiment of this document. FIGS. 2 to 4 are plan views illustrating various embodiments of a first opening pattern. FIG. 5 is a cross sectional view illustrating a first electrode.

As shown in FIGS. 1 to 5, the solar cell includes a substrate 110 that has front and back surfaces opposite to each other. The solar cell further includes an emitter portion 120, a first insulating layer 130, a plurality of first electrodes 140, a back surface field ("BSF") portion 150, a plurality of second electrodes 160, and a second insulating layer 170. The emitter portion 120 is disposed on the front surface of the substrate 110. The first insulating layer 130 is disposed on the emitter portion 120. The plurality of first electrodes 140 are disposed on the first insulating layer 130. The BSF portion 150 is disposed on the back surface of the substrate 110. The second insulating layer 170 is disposed on the BSF portion 150. The plurality of second electrodes 160 are disposed on the second insulating layer 170.

The substrate 110 is formed of a silicon wafer having a first conductive type, for example, an n conductive type. The silicon wafer may include mono-crystalline silicon, poly-crystalline silicon, or amorphous silicon.

The substrate 110 having the n conductive type contains an impurity of a Group 5 element, such as phosphorous (P), arsenic (As), or antimony (Sb).

According to an embodiment, the substrate 110 may have a p conductive type and may include a semiconductor material other than silicon.

In the case that the substrate 110 is of a p conductive type, the substrate 110 may contain an impurity of a Group 3 element, such as boron (B), gallium (Ga), or indium (In).

According to an embodiment, at least a surface of the substrate 110 may include a textured surface.

The emitter portion 120 contains an impurity having a second conductive type that is opposite to the conductive type of the substrate 110. For example, the emitter portion 120 is of a p conductive type, and forms a PN junction with the substrate 110.

Due to a built-in potential difference caused by the PN junction, electron-hole pairs split into electrons and holes, and the electrons and holes move toward an n type electrode and a p type electrode, respectively.

For example, if the substrate 110 is of an n type, and the emitter portion 120 is of a p type, then the electrons and holes are attracted to the substrate 110 and the emitter portion 120, respectively. Accordingly, the electrons for the substrate 110 and the holes for the emitter portion 120 become majority carriers.

The p conductive type emitter portion 120 may be formed by doping the substrate 110 with an impurity of a Group 3 element, such as B, Ga, or In.

In the case that the substrate 110 is of a p conductive type and the emitter portion 120 is of an n conductive type, the holes are attracted to the substrate 110, and the electrons are attracted to the emitter portion 120.

The n conductive type emitter portion 120 may be formed by doping the substrate 110 with an impurity of a Group 5 element, such as P, As, or Sb.

The first insulating layer 130 functions as an anti-reflection layer that reduces reflection of light incident on the front surface of the substrate 110 and increases selection of a specific wavelength of light, thus raising efficiency of the solar cell.

The first insulating layer 130 may be formed of a single layer that includes one of a silicon oxide film, a silicon nitride film, a titanium dioxide film, and an aluminum oxide film.

The first insulating layer 130 includes a first opening pattern C1 that exposes portions of the emitter portion 120. The first opening pattern C1 includes a plurality of openings.

The first opening pattern C1 may be formed to have a plurality of circular holes C1-1 arranged along a longitudinal direction of the first electrode 140 as shown in FIG. 2 or to have a plurality of elliptical holes C1-2 arranged along a longitudinal direction of the first electrode 140 as shown in FIG. 3. Further, as shown in FIG. 4, the first opening pattern C1 may be formed to be shaped as a stripe pattern C1-3 arranged along a longitudinal direction of the first electrode 140. However, the embodiments of this document are not limited thereto, and various shapes of the first opening pattern C1 may be possible.

The first opening pattern C1 has a width W2 smaller than a width W1 of an upper portion of the first electrode 140. According to an embodiment, the width W2 is less than 0.5 times the width W1.

Formation with the first opening pattern C1 having the width W2 may reduce a width W1' of a lower portion of the first electrode 140, which contacts the emitter portion 120 when the first electrode 140 is formed by electroplating, thus is capable of decreasing a recombination loss that occurs at a portion where the metal layer forming the first electrode 140 is adjacent to the substrate.

The first electrode 140 is physically and electrically connected to the emitter portion 120 through a member filling the first opening patterning C1. The first electrode 140 extends horizontally in a predetermined direction.

The first electrode 140 collects electric charges, for example, holes, attracted to the emitter portion 120.

The first electrode 140 includes an electroplated layer that includes a seed layer 141 directly contacting the emitter portion 120 and an electrode layer 142 disposed on the seed layer 141.

The seed layer 141 is formed of, for example, nickel silicide including NiSi, $Ni_2Si$, $NiSi_2$ or the like, to have a thickness of 50 nm to 200 nm.

If the thickness of the seed layer 141 is less than 50 nm, then contact resistance may increase, and if the thickness of the seed layer is greater than 200 nm, shunt leakage may occur due to diffusion of nickel during a thermal treatment for forming the seed layer.

As such, forming the seed layer 141 to have a thickness of 50 nm to 200 nm may prevent shunt leakage while reducing contact resistance.

The electrode layer 142 contains at least a conductive metal selected from the group consisting of Ni, Cu, Ag, Al, Sn, Zn, In, Ti, Au, and a combination thereof. However, the embodiments of this document are not limited thereto, and other conductive metals may also be included.

According to an embodiment, the electrode layer 142 includes a copper layer 142a. The copper layer 142a functions as an electric line. Copper is easily oxidized in the air, and it is not easy to solder directly to the copper layer 142a an interconnector, for example, a ribbon (not shown), for electrically connecting solar cell modules to one another.

Accordingly, in the case that the electrode layer 142 includes the copper layer 142a, a tin layer 142b may be further formed on the copper layer 142a to prevent oxidization of copper and to facilitate soldering process to the ribbon. According to an embodiment, the tin layer 142b is formed to have a thickness of 5 um to 15 um.

According to an embodiment, in the case that the electrode layer is formed of any other metal, such as silver (Ag), the tin layer 142b may be omitted.

According to an embodiment, a diffusion barrier layer (not shown) may be provided between the copper layer 142a and the seed layer 141.

A back surface field (BSF) portion 150 located at a back surface of the substrate 110 includes an area (for example, n+ area) doped with an impurity that has the same conductive type as an impurity contained in the substrate 110 and whose concentration is higher than a concentration of the impurity of the substrate 110.

The BSF portion 150 forms a potential barrier based on a difference in concentration of impurity between the BSF portion 150 and the substrate 110, interfering with the movement of holes toward a back surface of the substrate 110. Accordingly, the electrons and holes are less likely to recombine to perish near a surface of the substrate 110.

The second insulating layer 170, which functions as an anti-reflection layer, is disposed on a back surface of the BSF portion 150. The second electrodes 160 positioned on a back surface of the second insulating layer 170 gather electric charges, for example, electrons, attracted to the back surface of the substrate 110, and transfer the gathered electric charges to an external device (not shown).

According to an embodiment, each second electrode 160 may be formed to have the same structure as each first electrode 140. According to an embodiment, the second insulating layer 170 may be formed to have the same structure as the first insulating layer 130. For example, the second electrodes 160 may be physically and electrically connected to the BSF portion 150 through a plurality of openings in the second insulating layer 170.

According to an embodiment, the openings in the first insulating layer 130 and the second insulating layer 170 may be formed by dry etching using a laser.

Figure 6:
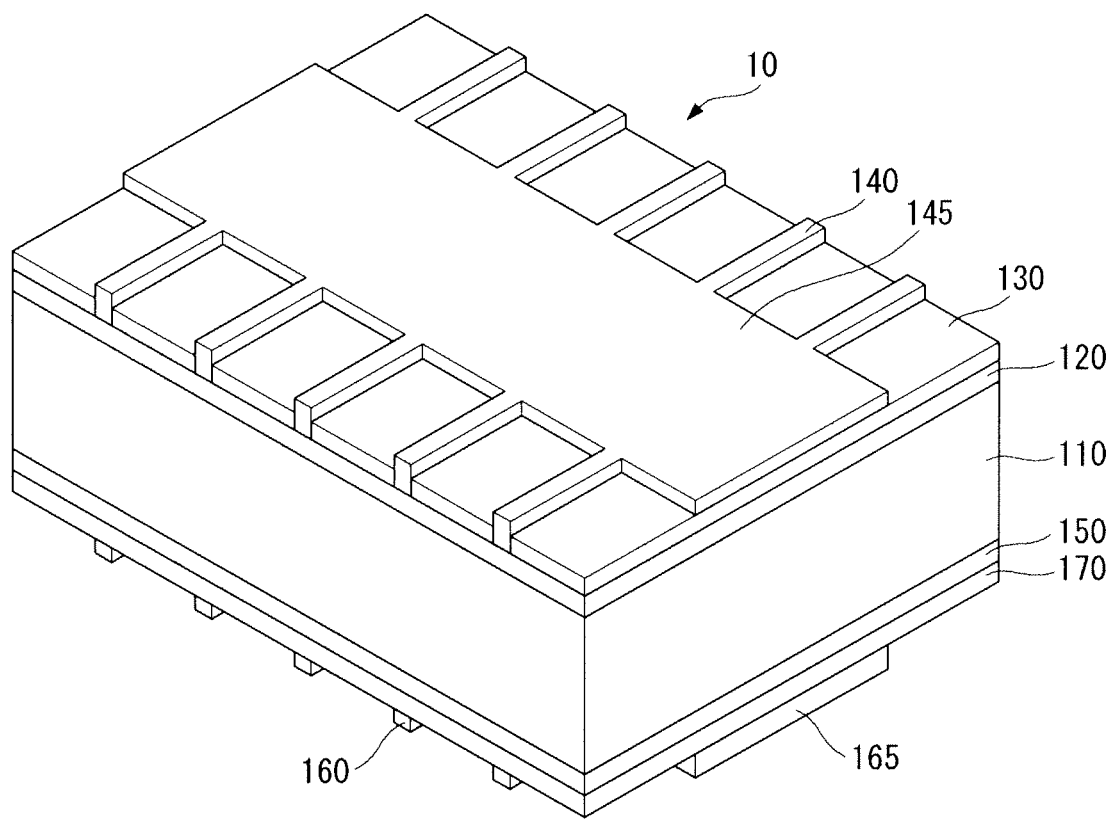
FIG. 6 is a perspective view illustrating a portion of a solar cell according to an embodiment of this document.

A solar cell according to an embodiment of this document will now be described with reference to FIGS. 6 to 8.

Compared to the solar cell described in connection with FIGS. 1 to 5, the solar cell according to the current embodiment further includes first current collectors 145 and second current collectors 165.

According to an embodiment, at least two first current collectors 145 are formed in a direction crossing the first electrodes 140. The first current collectors 145 are physically and electrically connected to the first electrodes 140.

The first current collectors 145 are also physically and electrically connected to the emitter portion 120. The first insulating layer 130 includes a second opening pattern C2 in addition to the first opening pattern C1 described in connection with FIGS. 1 to 5.

Figure 7:
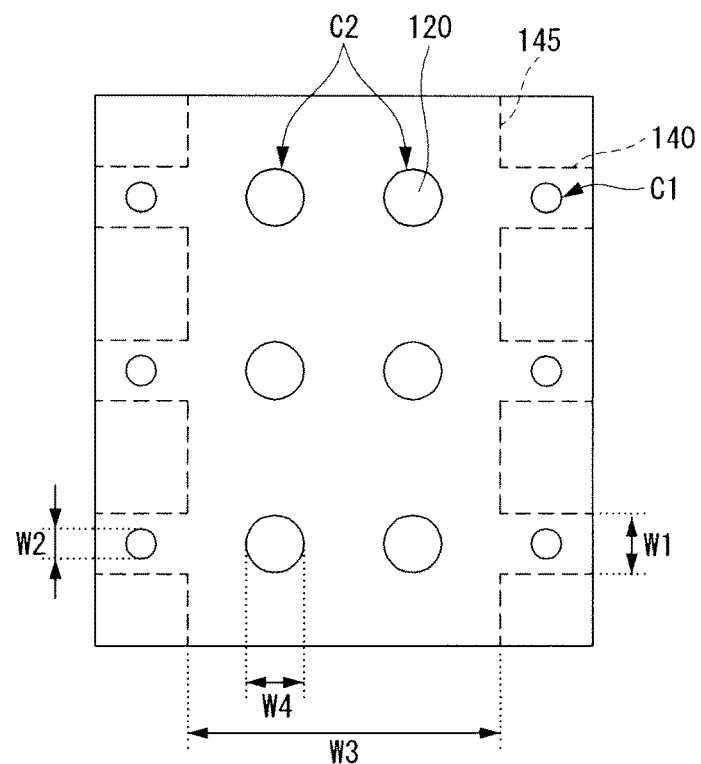
FIG. 7 is a plan view illustrating first and second openings according to an embodiment of this document.
Figure 8:
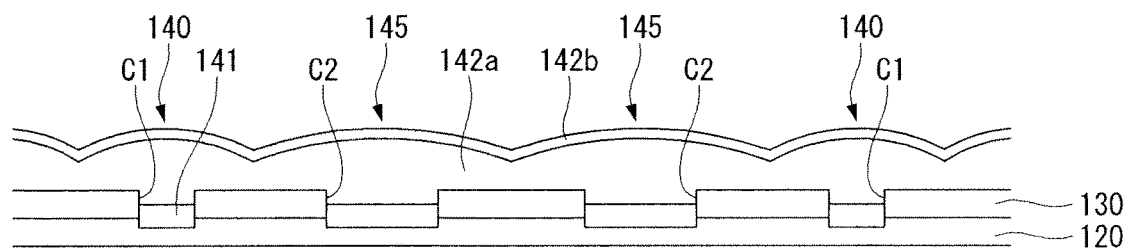
FIG. 8 is a cross sectional view illustrating first current collectors in a width direction according to an embodiment of this document.

Specifically, as shown in FIG. 7, the first insulating layer 130 includes the first opening pattern C1 having a plurality of first openings and the second opening pattern C2 having a plurality of second openings C2. Hereinafter, for convenience of description, the first opening pattern(s) is also denoted as "C1", and the second opening pattern(s) is also denoted as "C2".

The first openings C1 are formed under respective corresponding first electrodes 140, and the second openings C2 are formed under respective corresponding current collectors 145.

Although it has been illustrated in FIG. 7 that the second opening pattern C2 is formed so that each second opening is shaped as a circular hole, the second opening pattern C2 may also be formed so that each second opening has an elliptical hole shape or so that the second opening pattern has a stripe pattern as shown in FIGS. 3 and 4, respectively.

The first current collectors 145 collect electric charges at the first electrodes 140 and transfer the collected electric charges to an external device (not shown). For facilitating collection of the electric charges, the first current collector 145 is formed so that a width W3 of an upper portion of the first current collector 145 is larger than a width W1 of an upper portion of the first electrode 140.

As a consequence, a width W4 of the second opening C2, which is located under the corresponding first current collector 145, is formed to be larger than a width W2 of the first opening C1.

At least two second openings C2 may be arranged in a width direction of the first current collector 145.

The width W4 may be less than 0.5 times the width W3.

The first current collector 145 may be formed to have the same structure as the first electrode 140. For example, as shown in FIG. 8, the first current collector 145 may include a seed layer 141 and an electrode layer 142. The electrode layer 142 may include a copper layer 142a and a tin layer 142b.

According to an embodiment, the second current collector 165 may be formed to have the same structure as the first current collector 145. According to an embodiment, the second insulating layer 170 may be formed to have the same structure as the first insulating layer 130. For example, the second current collector 165 may be physically and electrically connected to the BSF portion 150 through the plurality of second openings on the second insulating layer 170.

The first opening pattern C1 and the second opening pattern C2 may be formed by dry etching using a laser.

Figure 9:
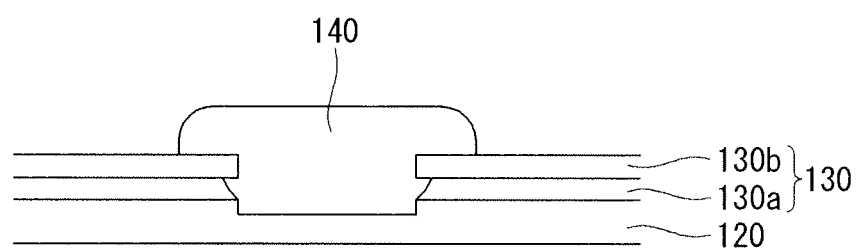
FIG. 9 is a cross sectional view illustrating a first electrode in a width direction according to an embodiment of this document.
Figure 10:
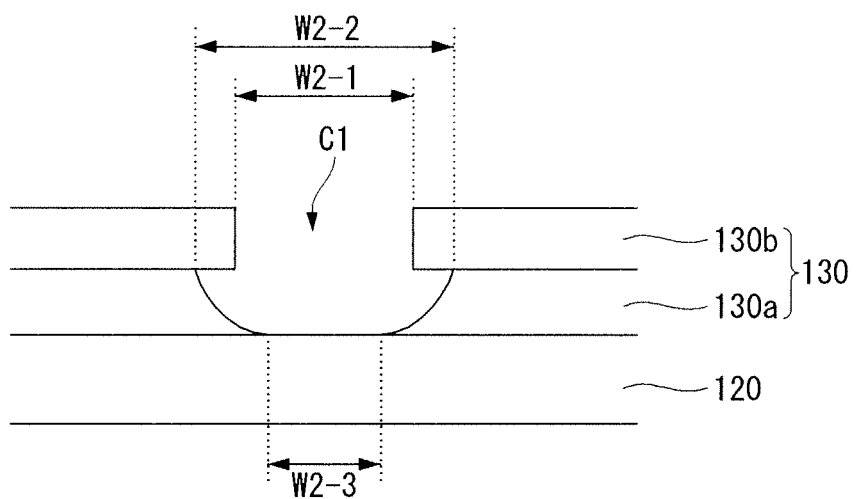
FIG. 10 is an expanded view of a portion of FIG. 9.

A solar cell according to an embodiment of this document will now be described with reference to FIGS. 9 and 10.

The solar cell includes a substrate 110, an emitter portion 120, and a first insulating layer 130 on a front surface of the emitter portion 120. The first insulating layer 130 contains a metal oxide-based material.

According to an embodiment, the first insulating layer 130 includes a first upper layer 130b formed of silicon nitride (SiNx:H) and a first lower layer 130a between the first upper layer 130b and the emitter portion 120.

The first lower layer 130a may be formed of a material, for example, aluminum oxide (AlOx), which exhibits a large difference in light absorption coefficient or band gap (Eg) with a silicon nitride layer.

The first lower layer 130a functions as a passivation film, and the first upper layer 130b functions as an anti-reflection film.

According to an embodiment, the first lower layer 130a may be also formed of silicon oxide (SiOx:H).

The first opening C1 is formed so that a width of the first opening C1 at the first lower layer 130a is different from a width of the first opening C1 at the first upper layer 130b and so that an area and average diameter of the first opening is greater at the first lower layer 130a than at the first upper layer 130b.

Specifically, a portion of the first opening C1 located at the first upper layer 130b is formed to have an even width W2-1, and a portion of the first opening C1 located at the first lower layer 130a is formed so that an upper width W2-2 is larger than a lower width W2-3.

The first opening C1 may be formed by dry etching or wet etching.

Specifically, the first insulating layer 130 and the second insulating layer 170 are formed on the emitter portion 120 and the BSF portion 150, respectively, wherein each of the first insulating layer 130 and the second insulating layer 170 includes an upper layer and a lower layer.

A dry etching process is performed on the structure using a laser beam to partially remove the first upper layer 130b of the first insulating layer 130 and the second upper layer (not shown) of the second insulating layer 170 to form portions of the first openings C1.

The laser beam may include a UV laser beam having a wavelength of about 355 nm.

The first lower layer 130a of the first insulating layer 130 and the second lower layer (not shown) of the second insulating layer 170 may prevent the substrate 110 from being damaged during the formation of the portions of the first openings C1 using the laser-based dry etching.

Subsequently, exposed portions of the first lower layer 130a and the second lower layer (not shown) are removed by selective wet etching, thus completing the first openings C1.

By doing so, particles generated during the dry etching process may be removed, thus eliminating the need for separately conducting a wet process.

During the wet etching process, an etchant is used that may etch out only the first lower layer 130a and the second lower layer, such as a BOE (Buffered Oxide Etchant), which may selectively etch a silicon nitride film and a metal oxide film.

According to an embodiment, before the formation of the emitter portion 120 and the BSF portion 150, the substrate 110 may be subject to a treatment that allows two opposite surfaces of the substrate 110 to become textured surfaces.

Specifically, the substrate 110, which is generally formed of a silicon wafer, is produced by slicing a silicon ingot or block with a blade or multi wire saw.

Such a silicon wafer is doped with a Group 5 impurity, such as P, thus completing a n conductive type semiconductor substrate 110.

While slicing the silicon ingot or block, a mechanical damage layer may be created on the silicon wafer.

The mechanical damage layer lowers characteristics of the solar cell. Accordingly, a wet etching process is performed to remove the mechanical damage layer. The wet etching process uses an alkaline or acid as an etchant.

After removing the mechanical damage layer, a wet etching process or a plasma-based dry etching process is carried out to form textured surfaces on the front and back surfaces of the substrate 110.

Various embodiments of the solar cells have been described. Solar cells are environmentally safe and provide for a renewal source of energy. Solar cells do not emit greenhouse gas emissions. Various embodiments of the solar cells provide for an efficient energy source.

What is claimed is:

1. A solar cell comprising:
a substrate having a first conductive type;
an emitter layer having a second conductive type opposite the first conductive type and on a first surface of the substrate;
a first insulating layer on the emitter layer, the first insulating layer including first and second openings exposing the emitter layer and on the same plane of the substrate; and
a first electrode on the emitter layer, the first electrode including first electrode parts and second electrode parts on the same plane of the substrate,
wherein each of the first electrode parts are electrically connected to the emitter layer through the first openings, is extended in a first direction, and is spaced apart from one another in a second direction crossing the first direction on the same plane of the substrate,
wherein each of the second electrode parts is electrically connected to the emitter layer through the second openings, is extended in the second direction configured to physically and electrically connect the first electrode parts, and is spaced apart from one another in the first direction,
wherein the first electrode includes an upper portion on the first insulating layer and a lower portion in a corresponding first or second opening, the bottom surface of the upper portion directly contacting an upper surface of the first insulating layer,
wherein a width of the upper portion of a first electrode part in the second direction is wider than a width of the lower portion of the first electrode part in the second direction,
wherein a width of the upper portion of a second electrode part in the first direction is wider than a width of the lower portion of the second electrode part in the first direction,
wherein the first electrode includes seed layers in the first and the second openings, and an electrode layer on the seed layer and forming the upper portion of the first and the second electrode parts, and
wherein the seed layer directly contacts the emitter layer exposed through the first and the second openings.

2. The solar cell of claim 1, wherein the first openings are formed in a circular hole pattern, elliptical hole pattern, or in a stripe pattern arranged in the first direction, and the second openings are formed in a circular hole pattern, elliptical hole pattern, or in a stripe pattern arranged in the second direction.

3. The solar cell of claim 1, wherein a width of one first opening in the second direction is less than a half width of the upper portion of the first electrode part in the second direction.

4. The solar cell of claim 1, wherein a width of one second opening in the first direction is less than a half width of the upper portion of the second electrode part in the first direction.

5. The solar cell of claim 1, wherein a width of one second opening in the first direction is wider than a width of one first opening in the second direction.

6. The solar cell of claim 1, wherein a width of one second opening in the first direction is equal to or less than a width of one first opening in the second direction.

7. The solar cell of claim 1, wherein at least two second openings are at the second electrode part, and wherein the at least two second openings are spaced apart from each other in the first direction.

8. The solar cell of claim 1, wherein the second electrode part includes at least two contact portions that contact the emitter layer, and wherein the at least two contact portions are spaced apart from each other in the first direction.

9. The solar cell of claim 1, wherein an entire bottom surface of the seed layer directly contacts the emitter layer exposed through the first and the second openings.

10. The solar cell of claim 1, wherein a depth of the first openings is substantially the same as a thickness of the first insulating layer.

11. The solar cell of claim 1, wherein the electrode layer includes one of a copper layer and a tin layer.

12. The solar cell of claim 1, wherein the electrode layer includes a copper layer and a tin layer on the copper layer.

13. The solar cell of claim 1, wherein a thickness of the electrode layer at the first or the second openings is thicker than a thickness of the electrode layer on the first insulating layer.

14. The solar cell of claim 1, further comprising:
a back surface field layer having the first conductive type and on a second surface of the substrate opposite the first surface; and
a second electrode on the second surface of the substrate and electrically connected to the back surface field layer.

15. The solar cell of claim 14, wherein the second electrode includes third electrode parts extending in the first direction and spaced apart from one another in the second direction and fourth electrode parts extending in the second direction and physically connecting the third electrode parts.

16. The solar cell of claim 15, wherein the second electrode has the same structure as the first electrode.

17. The solar cell of claim 15, further comprising a second insulating layer on the back surface field layer.

18. The solar cell of claim 17, wherein the second insulating layer has the same structure as the first insulating layer.

19. The solar cell of claim 17, wherein the second insulating layer includes third openings and fourth openings exposing the back surface field layer, and wherein the third electrode parts are positioned in the third openings and are electrically connected to the back surface field layer through the third openings, and the fourth electrode parts are positioned in the fourth openings and are electrically connected to the back surface field layer through the fourth openings.

20. The solar cell of claim 1, wherein the first insulating layer includes one of hydrogenated silicon oxide layer (SiOx:H), hydrogenated silicon nitride layer (SiNx:H), and aluminum oxide layer (AlOx).

21. The solar cell of claim 20, wherein the first insulating layer includes a first upper layer and a first lower layer between the first upper layer and the emitter layer.

22. The solar cell of claim 21, wherein the first lower layer is formed of hydrogenated silicon oxide layer (SiOx:H) or aluminum oxide (AlOx).

23. The solar cell of claim 21, wherein the first upper layer is formed of hydrogenated silicon nitride layer (SiNx:H) and the first lower layer is formed of hydrogenated silicon oxide layer (SiOx:H).

24. The solar cell of claim 1, wherein a thickness of the emitter layer under the first insulating layer is thicker than a thickness of the emitter layer under the first and the second openings.

25. The solar cell of claim 1, wherein the seed layers are spaced from one another, and electrically connected to each other through the electrode layer covering at least two seed layers in the first or the second directions.

26. The solar cell of claim 1, wherein the first surface of the substrate is a light incident surface.

27. The solar cell of claim 1, wherein each of the seed layers is the lower portion of the first electrode.

28. The solar cell of claim 1, further comprising a diffusion barrier layer between the seed layer and the electrode layer.

29. The solar cell of claim 1, wherein a width of the upper portion of the second electrode part in the first direction is wider than a width of the upper portion of the first electrode part in the second direction.

30. The solar cell of claim 1, wherein a thickness of each of the seed layers is 50 nm to 100 nm.

31. The solar cell of claim 1, wherein the first and the second openings are formed by laser ablation to expose the emitter layer.

32. The solar cell of claim 19, wherein the third and the fourth openings are formed by laser ablation to expose the back surface field layer.

* * * * *